(12) United States Patent
Song et al.

(10) Patent No.: US 10,608,072 B2
(45) Date of Patent: Mar. 31, 2020

(54) TRANSPARENT DISPLAY PANEL, MANUFACTURING METHOD THEREOF, AND TRANSPARENT DISPLAY APPARATUS

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/427,115

(22) Filed: May 30, 2019

(65) Prior Publication Data

US 2020/0066820 A1 Feb. 27, 2020

(30) Foreign Application Priority Data

Aug. 24, 2018 (CN) .......................... 2018 1 0974918

(51) Int. Cl.
*H01L 27/00* (2006.01)
*H01L 27/32* (2006.01)

(52) U.S. Cl.
CPC ...... *H01L 27/3276* (2013.01); *H01L 27/3279* (2013.01); *H01L 2227/323* (2013.01)

(58) Field of Classification Search
CPC ............. H01L 27/3276; H01L 27/3279; H01L 27/14609; H01L 27/146; H01L 27/14601; H01L 2227/323
See application file for complete search history.

(56) References Cited

U.S. PATENT DOCUMENTS

| 6,249,469 | B1 * | 6/2001 | Hardee | G11C 7/065 365/205 |
| 6,323,490 | B1 * | 11/2001 | Ikeda | H01L 27/14659 250/370.07 |
| 7,982,385 | B2 * | 7/2011 | Kimura | H01L 27/3213 313/503 |
| 8,816,294 | B2 * | 8/2014 | Lee | H01L 31/0224 250/370.08 |
| 10,229,964 | B2 * | 3/2019 | Kim | H01L 27/3276 |
| 2011/0102413 | A1 * | 5/2011 | Hamer | G09G 3/3233 345/213 |
| 2011/0139994 | A1 * | 6/2011 | Lee | H01L 31/0224 250/370.09 |
| 2013/0256638 | A1 * | 10/2013 | Uesugi | H01L 51/5228 257/40 |
| 2018/0068621 | A1 * | 3/2018 | Lee | G09G 3/3225 |
| 2018/0240856 | A1 * | 8/2018 | Kim | H01L 27/3276 |

* cited by examiner

Primary Examiner — Nikolay K Yushin
(74) Attorney, Agent, or Firm — Kinney & Lange, P.A.

(57) ABSTRACT

A transparent display panel, a manufacturing method thereof, and a transparent display apparatus are disclosed. The transparent display panel includes: a substrate including a non-transparent region and a transparent region; a first power line and a first read line both disposed on the substrate and arranged in the same layer; a dielectric layer covering both the first power line and the first read line; a second power line and a second read line both disposed on a side of the dielectric layer facing away from the substrate and arranged in the same layer. The second power line is electrically connected to the first power line through a first conductive plug extending through the dielectric layer, and the second read line is electrically connected to the first read line through a second conductive plug extending through the dielectric layer.

20 Claims, 12 Drawing Sheets

TRANSPARENT DISPLAY PANEL, MANUFACTURING METHOD THEREOF, AND TRANSPARENT DISPLAY APPARATUS

CROSS-REFERENCE TO RELATED APPLICATION

This application claims the benefit of Chinese Patent Application No. 201810974918.4 filed on Aug. 24, 2018 in the State Intellectual Property Office of China, the whole disclosure of which is incorporated herein by reference.

TECHNICAL FIELD

The present disclosure relates to the field of display technologies, and in particular, to a transparent display panel, a transparent display apparatus, and a method of manufacturing a transparent display panel.

BACKGROUND

Currently, display apparatuses are presented in the display market and in daily lives of ordinary people in increasingly diverse and novel forms. For example, these display apparatuses include: a liquid crystal display (abbreviated as LCD) that is developed towards ultra-high resolution, a small and medium size organic light-emitting diode (abbreviated as OLED) display apparatus that is widely used in a portable device such as mobile phone or pad, and a large size OLED display apparatus that is used in a television and is becoming more and more mature. At the same time, with the development of information society, display technologies such as transparent display apparatus have obtained a good user experience and a broad market prospect.

In the transparent display apparatus, as an area of a transparent region thereof is becoming large, the transparency thereof is becoming large and the haze thereof is becoming small, so that an image observed through a display panel is becoming clear. Since the haze is related to an arrangement of metal lines in the display panel, generally speaking, light scattering is becoming severe as the reflective metal is becoming large, so that the haze is becoming large. Therefore, in the transparent display pixel layout, it is an important issue for those skilled in the art to arrange signal lines so as to improve the transparency of the display panel.

SUMMARY

In an aspect, a transparent display panel is provided including: a substrate including a non-transparent region and a transparent region; a first power line and a first read line both disposed on the substrate and arranged in the same layer, an orthographic projection of each of the first power line and the first read line on the substrate located within the non-transparent region; a dielectric layer covering both the first power line and the first read line; a second power line and a second read line both disposed on a side of the dielectric layer facing away from the substrate and arranged in the same layer, wherein the second power line is electrically connected to the first power line through a first conductive plug extending through the dielectric layer, and the second read line is electrically connected to the first read line through a second conductive plug extending through the dielectric layer.

Optionally, the transparent display panel further includes a plurality of first data lines, wherein the plurality of first data lines are arranged in the same layer as both the first power line and the first read line, an orthographic projection of the second power line on the substrate at least partially overlaps with an orthographic projection of at least one of the first data lines on the substrate, and an orthographic projection of the second read line on the substrate at least partially overlaps with an orthographic projection of at least one of the first data lines on the substrate.

Optionally, an orthographic projection of each of the first power line, the first read line and the first data lines on the substrate is located within the non-transparent region.

Optionally, an orthographic projection of each of the second power line and the second read line on the substrate is located within the non-transparent region.

Optionally, the transparent display panel further includes a second data line and a third data line, wherein the second data line is arranged in the same layer as both the first power line and the first read line, and an orthographic projection of the second data line on the substrate is located within the non-transparent region; and wherein the third data line is arranged in the same layer as both the second power line and the second read line, and the third data line is electrically connected to the second data line through a third conductive plug extending through the dielectric layer.

Optionally, an orthographic projection of the third data line, an orthographic projection of the second power line, and an orthographic projection of the second read line on the substrate are spaced apart from one another.

Optionally, each of the second power line, the second read line, and the third data line includes a first portion and a second portion, an orthographic projection of the first portion of each of the second power line, the second read line, and the third data line on the substrate is located within the transparent region, and an orthographic projection of the second portion of each of the second power line, the second read line, and the third data line on the substrate is located within the non-transparent region.

Optionally, each of the first conductive plug, the second conductive plug, and the third conductive plug is located within the non-transparent region.

Optionally, the transparent display panel further includes a fourth data line and a fifth data line, wherein the fourth data line is arranged in the same layer as both the first power line and the first read line; and wherein a distance between the fifth data line and an upper surface of the substrate is equal to a distance between the fourth data line and the upper surface of the substrate, the distance between the fifth data line and the upper surface of the substrate is less than a distance between the upper surface of the substrate and at least one of the second power line and the second read line, and the fifth data line is electrically connected to the fourth data line.

Optionally, a recess exposing the substrate is formed in the dielectric layer, and the fifth data line is located in the recess.

Optionally, each of the second power line, the second read line, and the fifth data line includes a first portion and a second portion, an orthographic projection of the first portion of each of the second power line, the second read line, and the fifth data line on the substrate is located within the transparent region, and an orthographic projection of the second portion of each of the second power line, the second read line, and the fifth data line on the substrate is located within the non-transparent region.

Optionally, a spacing between an orthographic projection of the first portion of the fifth data line on the substrate and an orthographic projection of one of the second power line and the second read line on the substrate is equal to zero.

Optionally, the transparent display panel further includes: a thin film transistor on the substrate, the thin film transistor including a source electrode and a drain electrode arranged in the same layer; and an OLED display device on the substrate, the OLED display device including an anode, wherein each of the first power line and the first read line is arranged in the same layer as both the source electrode and the drain electrode, and each of the second power line and the second read line is arranged in the same layer as the anode.

Optionally, the dielectric layer includes a passivation layer and a planarization layer disposed in a stacked manner, and the planarization layer is located on a side of the passivation layer facing away from the substrate.

In another aspect, a transparent display apparatus including the transparent display panel as described above is provided.

In a further aspect, a method of manufacturing a transparent display panel is provided, including: forming a first power line and a first read line on the substrate such that the first power line and the first read line are arranged in the same layer; forming a dielectric layer covering both the first power line and the first read line on the substrate; forming via holes in the dielectric layer; and forming a second power line and a second read line on a side of the dielectric layer facing away from the substrate, such that the second power line and the second read line are arranged in the same layer, the second power line is electrically connected to the first power line through a first conductive plug located in one of the via holes in the dielectric layer, and the second read line is electrically connected to the first read line through a second conductive plug located in one of the via holes in the dielectric layer.

Optionally, the step of forming the first power line and the first read line on the substrate includes: forming a first data line while forming the first power line and the first read line, such that the first power line, the first read line, and the first data line are arranged in the same layer.

Optionally, the step of forming the first power line and the first read line on the substrate includes: forming a second data line while forming the first power line and the first read line, such that the first power line, the first read line, and the second data line are arranged in the same layer; and wherein the step of forming the second power line and the second read line on the side of the dielectric layer facing away from the substrate includes: forming a third data line while forming the second power line and the second read line, such that the second power line, the second read line, and the third data line are arranged in the same layer, and the third data line is electrically connected to the second data line through a third conductive plug located in one of the via holes in the dielectric layer.

Optionally, the step of forming the first power line and the first read line on the substrate includes: forming a fourth data line while forming the first power line and the first read line, such that the first power line, the first read line, and the fourth data line are arranged in the same layer; wherein the step of forming the via holes in the dielectric layer includes: forming the via holes in the dielectric layer to expose both the first power line and the first read line; and forming a recess in the dielectric layer to expose the substrate; and wherein the step of forming the second power line and the second read line on the side of the dielectric layer facing away from the substrate includes: forming a fifth data line in the recess while forming the second power line and the second read line, such that the fifth data line is electrically connected to the fourth data line.

Optionally, the method further includes: forming a thin film transistor and an OLED display device on the substrate, wherein the thin film transistor includes a source electrode and a drain electrode arranged in the same layer, and the OLED display device includes an anode; and wherein each of the first power line and the first read line is formed through the same one patterning process as both the source electrode and the drain electrode, and each of the second power line and the second read line is formed through the same one patterning process as the anode.

DETAILED DESCRIPTION OF EMBODIMENTS

In order to make objectives, characteristics and advantages of the present disclosure become more apparent, the present disclosure will be described in detail in conjunction with the accompanying drawings and specific embodiments.

Herein, an expression "transparent region" refers to a region, through which light may pass, on a display panel, and an expression "non-transparent region" refers to a region, through which light may not pass, on the display panel, for example, when the user observes the display panel, the user may observe objects on a side of the display panel facing away from the user through the "transparent region" of the display panel.

Herein, unless otherwise stated, an expression "same layer" or "arranged in the same layer" means that a plurality of layers, parts, members, elements, portions, and the like may be composed of the same material and formed through the same one patterning process.

Herein, unless otherwise stated, an expression "source-drain metal" refers to metal material for forming a source electrode and a drain electrode of a thin film transistor, and an expression "anode metal" refers to metal material for forming an anode of an electroluminescent display device such OLED display device.

Figure 1:
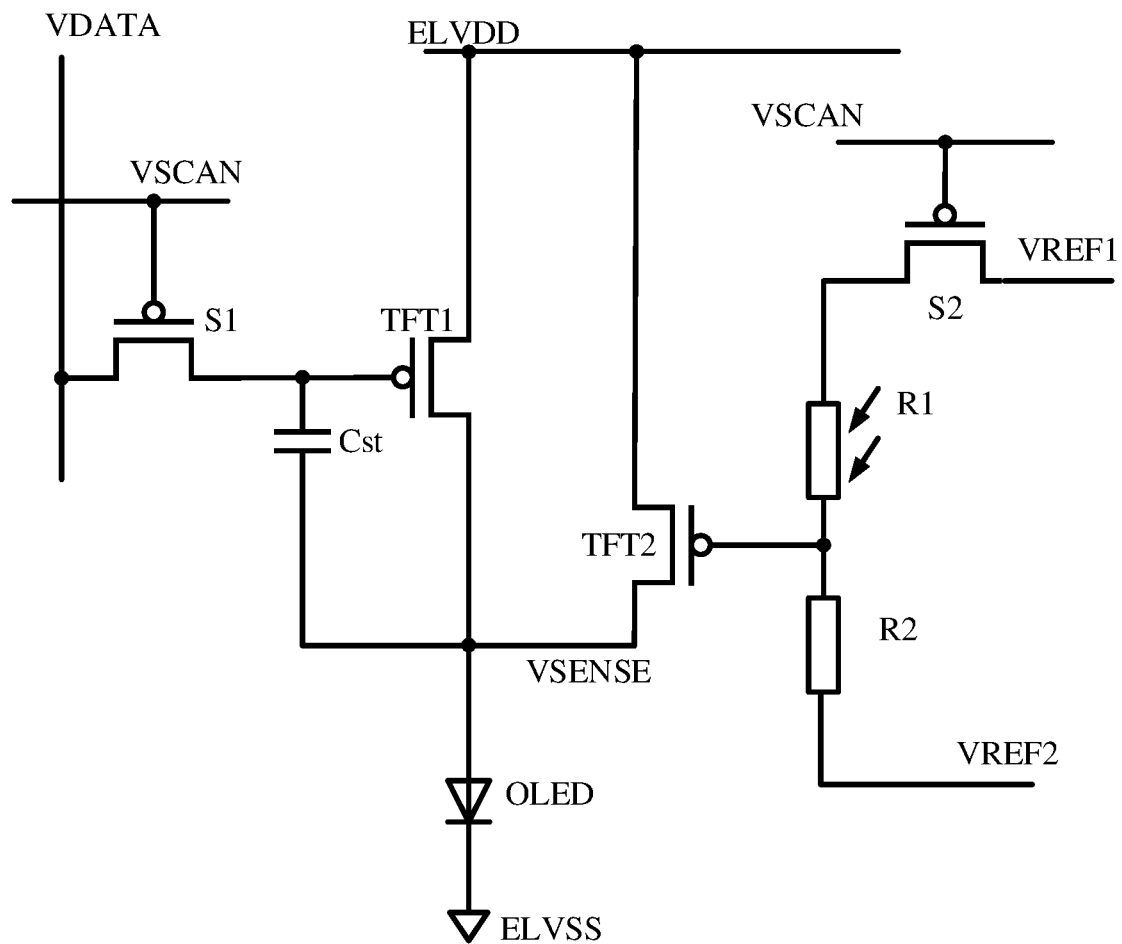
FIG. 1 is a circuit diagram of a pixel driving circuit of a transparent display apparatus according to some embodiments of the present disclosure.

FIG. 1 is a circuit diagram of a pixel driving circuit of a transparent display apparatus according to some embodiments of the present disclosure. In the illustrated embodiment, an OLED pixel driving circuit having a compensation circuit will be described as an example. In the embodiment shown in FIG. 1, 2T1C circuit is taken as an example of the pixel driving circuit, which includes a driving transistor TFT1, a switching transistor S1, and a storage capacitor Cst. Specifically, a source electrode of the driving transistor TFT1 is electrically connected to a first voltage (for example, the first voltage may be supplied by an ELVDD power line), a drain electrode thereof is electrically connected to an anode of an OLED and a second end of the storage capacitor Cst, and a cathode of the OLED is electrically connected to a second voltage (for example, the second voltage may be supplied by an ELVSS power line). A gate electrode of the switching transistor S1 is electrically connected to a scan signal line VSCAN, a source electrode thereof is electrically connected to a data line VDATA, and a drain electrode thereof is electrically connected to a first end of the storage capacitor Cst and a gate electrode of the driving transistor TFT1.

As shown in FIG. 1, the OLED pixel driving circuit further includes a compensation circuit including a sensing element, a synchronous transistor S2, a compensation driving transistor TFT2, a divider resistor R2, and the like.

The sensing element may be a photoresistor R1, and the photoresistor R1 and the divider resistor R2 are connected in series to form a series branch. A first end of the series branch is a constrained end which is electrically connected to the synchronous transistor S2, and a second end thereof is a free end which is electrically connected to a second reference voltage terminal VREF2.

A gate electrode of the synchronous transistor S2 is electrically connected to the scan signal line VSCAN, a drain electrode thereof is electrically connected to the constrained end of the series branch, and a source electrode thereof is electrically connected to a first reference voltage terminal VREF1. A gate electrode of the compensation driving transistor TFT2 is electrically connected to a series connection point between the photoresistor R1 and the divider resistor R2, a source electrode thereof is electrically connected to the ELVDD power line, and a drain electrode thereof may be electrically connected to both the second end of the storage capacitor Cst and the anode of the OLED through a sensing signal output line VSENSE.

For example, the first reference voltage VREF1 at the first reference voltage terminal is greater than the second reference voltage VREF2 at the second reference voltage terminal, and the second reference voltage VREF2 is smaller than a threshold voltage of the OLED.

In the embodiment shown in FIG. 1, the OLED pixel driving circuit may employ N-type thin film transistors, and the compensation circuit may employ a positive-coefficient photoresistor R1 to detect light emitted from the OLED. In other words, in the present embodiment, the synchronous transistor S2 and the compensation drive transistor TFT2 are N-type thin film transistors, and the photoresistor R1 is a positive-coefficient photoresistor whose resistance is increased as the light brightness emitted from the OLED becomes large. For the positive-coefficient photoresistor R1, the resistance thereof is small in absence of light, and the resistance thereof becomes large if the photoresistor R1 is illuminated with light, and the resistance is increased as the light brightness emitted from the OLED becomes large.

In the embodiment shown in FIG. 1, the transparent display apparatus needs to be provided with signal lines for transmitting various electrical signals, such as power line ELVDD, scan signal line VSCAN, data line VDATA, sensing signal output line VSENSE, and the like.

Hereinafter, some embodiments in which these signal lines are arranged in a transparent display panel will be described in detail with reference to the accompanying drawings.

Figure 2:
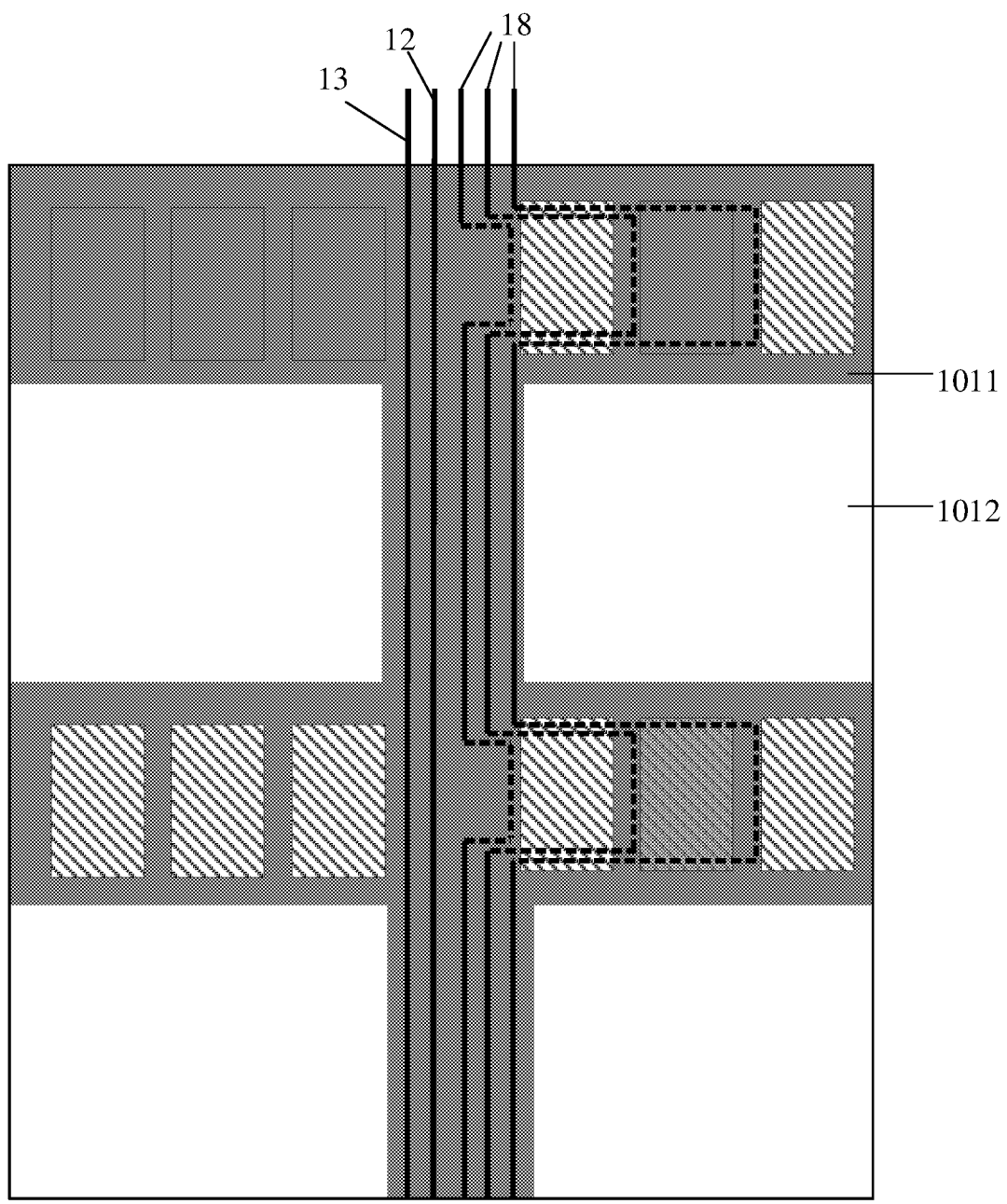
FIG. 2 is a schematic plan view of a transparent display panel according to some embodiments of the present disclosure.

FIG. 2 is a schematic plan view of a transparent display panel according to some embodiments of the present disclosure. As shown in FIG. 2, the transparent display panel may include: a substrate which includes a non-transparent region 1011 and a transparent region 1012; a power line 12, a read line 13, and a data line 18 on the substrate. An orthographic projection of each of the power line 12, the read line 13 and the data line 18 on the substrate is located within the non-transparent region 1011. For example, the power line 12, the read line 13 and the data line 18 may be respectively various signal lines, such as the power line ELVDD, the sensing signal output line VSENSE, the data line VDATA shown in FIG. 1. In the embodiment shown in FIG. 2, these signal lines are gathered to reduce an area occupied by these signal lines, thereby increasing an area of the transparent region and reducing the haze. In the embodiment shown in FIG. 2, these signal lines 12, 13, 18 are arranged side by side in the same layer. However, the inventors have found that the signal lines are typically composed of conductive metal material, and metal lines for transmitting different signals are arranged side by side in the same layer, so that it is liable to cause signal crosstalk or antenna effect. In the context, the expression "signal crosstalk" is meant that a signal transmitted over a metal line may be undesirably interfered with signals on adjacent metal lines due to electromagnetic coupling; the expression "antenna effect" means that each metal line exposed during the manufacturing process may be considered as an antenna, so that it may collect charged particles such as charged particles generated during plasma etching, resulting in an increase in electric potential on the metal line. Further, the signal lines 12, 13, 18 are arranged side by side in the same layer, so that they may occupy a large area of the non-transparent region. As a result, an area of the transparent region is reduced, and it is disadvantageous for transparent display.

Figure 3:
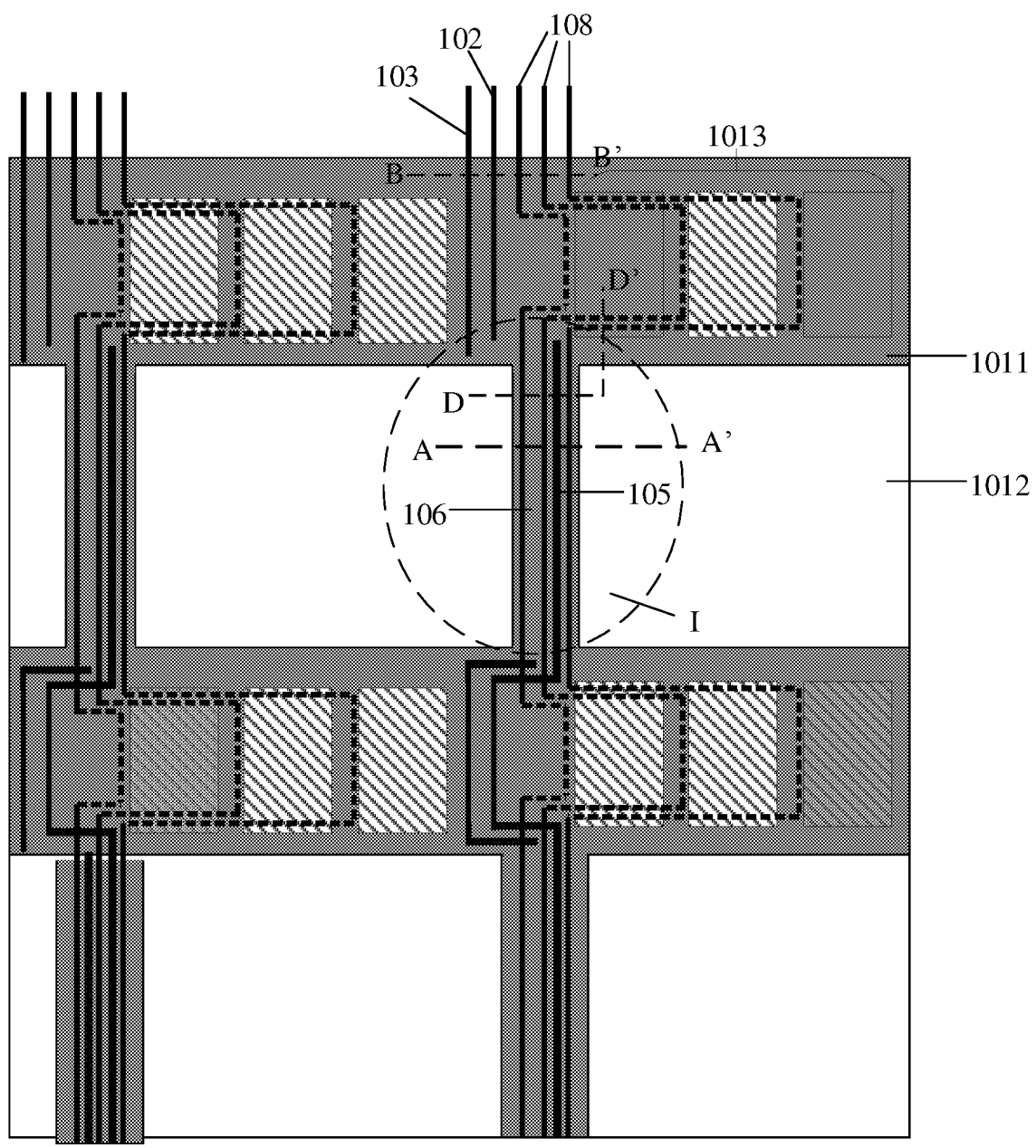
FIG. 3 is a schematic plan view of a transparent display panel according to some other embodiments of the present disclosure.
Figure 4A:
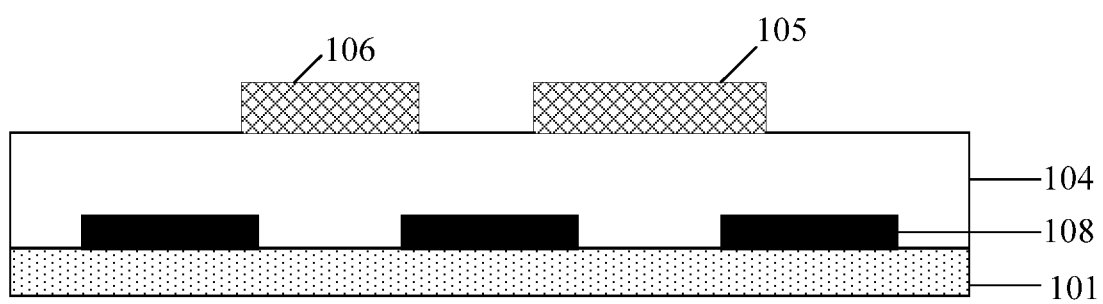
FIG. 4A is a cross-sectional view of the transparent display panel taken along line AA' in FIG. 3.
Figure 4B:
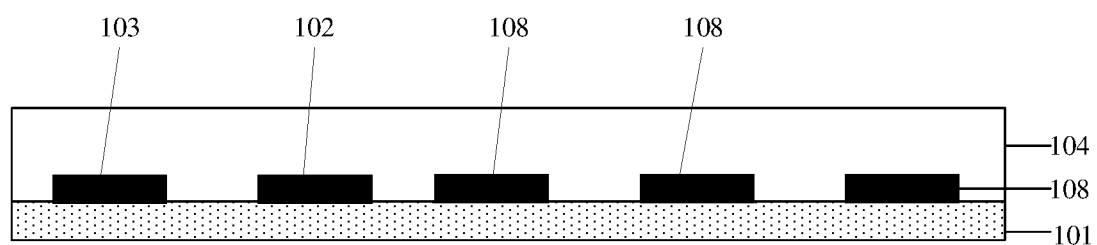
FIG. 4B is a cross-sectional view of the transparent display panel taken along line BB' in FIG. 3.

FIG. 3 is a schematic plan view of a transparent display panel according to some embodiments of the present disclosure, FIG. 4A is a cross-sectional view of the transparent display panel taken along line AA' in FIG. 3, and FIG. 4B is a cross-sectional view of the transparent display panel taken along line BB' in FIG. 3. With reference to FIG. 3, FIG. 4A and FIG. 4B, the transparent display panel may include a substrate 101 including a non-transparent region 1011 and a transparent region 1012; a first power line 102 and a first a read line 103 both on the substrate, an orthographic projection of each of the first power line 102 and the first read line 103 on the substrate 101 located within the non-transparent region 1011; a dielectric layer 104 covering both the first power line 102 and the first read line 103; and a second power line 105 and a second read line 106 both on the dielectric layer 104. An orthographic projection of each of the second power line 105 and the second read line 106 on the substrate 101 is located within the non-transparent region 1011. In other words, both the first power line 102 and the first read line 103 are located within a first layer, both the second power line 105 and the second read line 106 are located within a second layer, and the first layer and the second layer are different layers. For example, the first layer is on a side of the dielectric layer 104 facing towards the substrate 101, and the second layer is on a side of the dielectric layer 104 facing away from the substrate 101.

Figure 4C:
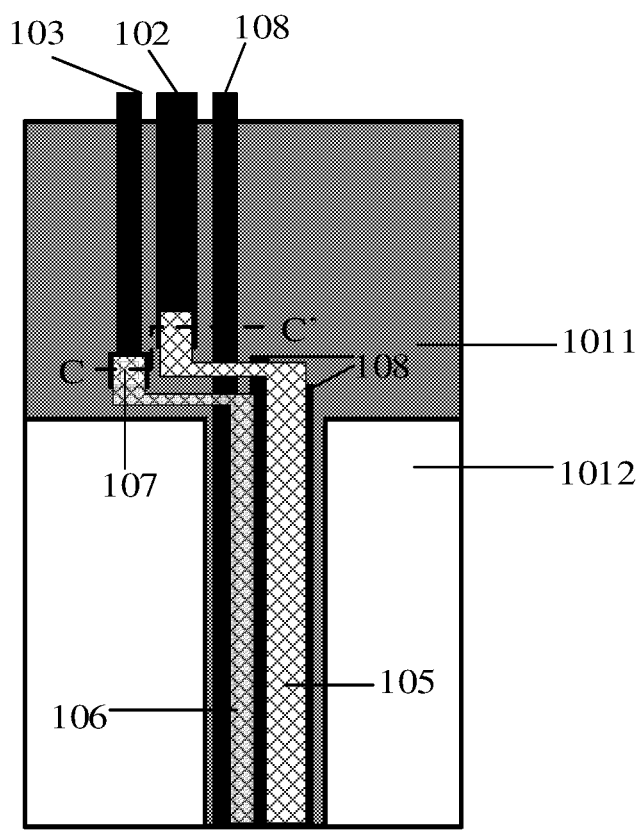
FIG. 4C is a partial enlarged view of a portion I enclosed by a broken-line frame of the transparent display panel in FIG. 3.
Figure 4D:
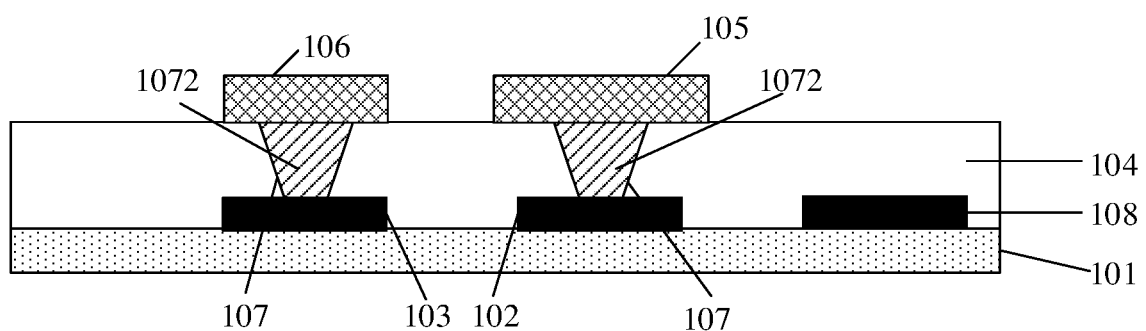
FIG. 4D is a cross-sectional view of the transparent display panel taken along line CC' in FIG. 4C.

FIG. 4C is a partial enlarged view of a portion I enclosed by a broken-line frame of the transparent display panel in FIG. 3, and FIG. 4D is a cross-sectional view of the transparent display panel taken along line CC' in FIG. 4C. Referring to FIG. 4C and FIG. 4D, a plurality of via holes 107 are formed in the dielectric layer 104, and each of the via holes 107 is filled with conductive material to form a conductive plug 1072 therein. The second power line 105 is electrically connected to the first power line 102 through a first conductive plug 1072, and the second read line 106 is electrically connected to the first read line 103 through a second conductive plug 1072.

In the present embodiment, the transparent display panel includes a substrate 101 that is divided into the non-transparent region 1011 and the transparent region 1012. A pixel unit 1013 is provided in the non-transparent region 1011, and the pixel unit 1013 may include R, G, B sub-pixels, referring to FIG. 3. The first power line 102 and the first read line 103 are formed on the substrate 101 and are both located only in the non-transparent region 1011.

For example, with reference to FIG. 1 and FIG. 3, the first power line 102 may be the ELVDD power line for supplying a power voltage. The first read line 103 may be a signal line VSENSE in the transparent display panel, which is electrically connected to an output end of the compensation driving transistor TFT2 of the pixel driving circuit for external compensation.

Both the first power line 102 and the first read line 103 are covered with the dielectric layer 104, and a plurality of via holes 107 and a plurality of conductive plugs 1072 formed in the plurality of via holes 107 are formed in the dielectric layer 104, and both the second power line 105 and the second read line 106 are formed on the dielectric layer 104. The second power line 105 is electrically connected to the first power line 102 through the conductive plug 1072. The second read line 106 is electrically connected to the first read line 103 through the conductive plug 1072. As the first power line and the first read line are arranged in a lower layer while the second power line and the second read line are arranged in an upper layer, so that the crosstalk between different signals is effectively reduced and the antenna effect is avoided.

Optionally, referring to FIG. 3, the transparent display panel further includes a first data line 108. For example, for each of the pixel units 1013, three first data lines 108 electrically connected to the R, G, and B sub-pixels, respectively, may be disposed. For example, the first data line 108 may be the data line VDATA shown in FIG. 1.

The first data line 108 is arranged in the same layer as both the first power line 102 and the first read line 103. In other words, the first data line 108 is also located within the first layer, that is, on the side of the dielectric layer 104 facing towards the substrate 101.

Referring to FIG. 4B, orthographic projections of the first data line 108 and the first power line 102, the first read line 103 on the substrate 101 do not overlap with one another, that is, the first data line 108 and the first power line 102, the first read line 103 are arranged side by side in the non-transparent region 1011.

Referring to FIG. 4A and FIG. 4C, an orthographic projection of the second power line 105 on the substrate 101 at least partially overlaps with an orthographic projection of the first data line 108 on the substrate 101, and an orthographic projection of the second read line 106 on the substrate 101 at least partially overlaps with the orthographic projection of the first data line 108 on the substrate 101.

In the embodiment, the first data line 108 is arranged in the same layer as both the first power line 102 and the first read line 103, and the first data line 108 is located within the non-transparent region 1011 for providing data signal to the pixel unit 1013. For example, the pixel unit 1013 includes R, G, and B sub-pixels, and three first data lines 108 are electrically connected to three sub-pixels, respectively.

When the second power line 105 and the second read line 106 are formed, both the second power line 105 and the second read line 106 may be formed over the first data line 108 such that the orthographic projection of each of the second power line 105 and the second read line 106 on the substrate 101 partially covers the orthographic projection of at least one first data line 108 on the substrate 101. With such an arrangement, the metal lines may be arranged more densely, so that the area of the transparent region is increased, and the transparency is improved, thereby improving the transparent display effect.

Figure 5:
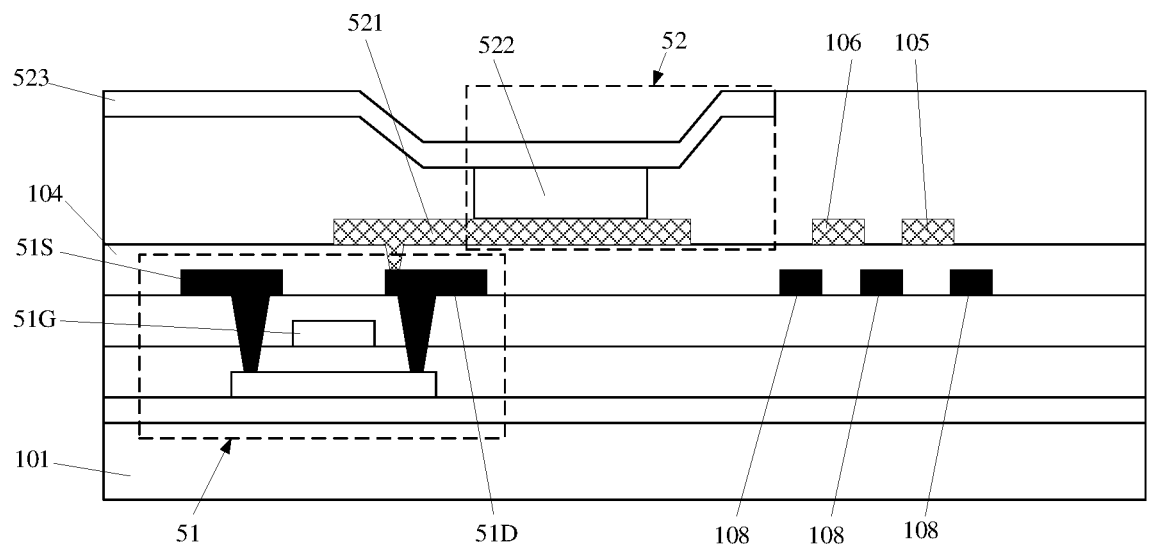
FIG. 5 is a cross-sectional view of the transparent display panel taken along line DD' in FIG. 3.

Optionally, the first data line 108, the first power line 102, and the first read line 103 located within the first layer are all formed of source-drain metal, and the second power line 105 and the second read line 106 located within the second layer are both formed of anode metal. Specifically, FIG. 5 shows a cross-sectional view of the transparent display panel taken along line DD' in FIG. 3. The transparent display panel may include a thin film transistor 51 (such as the driving transistor TFT1 shown in FIG. 1) and an OLED display device 52 disposed on the substrate 101. The thin film transistor 51 may include a gate electrode 51G, a source electrode 51S, and a drain electrode 51D, and the OLED display device 52 may include an anode 521, a light-emitting layer 522, and a cathode 523.

Referring to FIGS. 4A-5, the first data line 108, the first power line 102, and the first read line 103 may all be in the same layer as both the source electrode 51S and the drain electrode 51D of the thin film transistor. The second power line 105 and the second read line 106 may both be in the same layer as the anode 521 of the OLED display device.

In this way, the first data line, the first power line, and the first read line may all be formed through the same patterning process as the source electrode and the drain electrode of the thin film transistor, and the second power line and the second read line may both be formed through the same patterning process as the anode, so that the line arrangement provided by the embodiments of the present disclosure may be realized without increasing the complexity of the manufacturing process. Moreover, the second power line 105 and the second read line 106 are both formed of the anode metal, so that the haze may be reduced and the transparent display effect may be further improved.

For example, the source electrode, the drain electrode, the first data line, the first power line, and the first read line may employ a single layer of metal such as Ag, Cu, Al, Mo; or a single layer of metal alloy such as AlNd or MoNb; or multilayered metal such as MoNb/Cu/MoNb; or a stacked structure such as Mo/AlNd/ITO, ITO/Ag/ITO and the like. The embodiments of the present disclosure are not limited thereto, and may be set according to actual conditions.

Optionally, the anode, the second power line, and the second read line may employ an ITO/Ag/ITO stacked structure. Of course, they may also employ other stacked structures, which are not limited in detail in the embodiments of the present disclosure, and may be set according to actual conditions.

Figure 6:
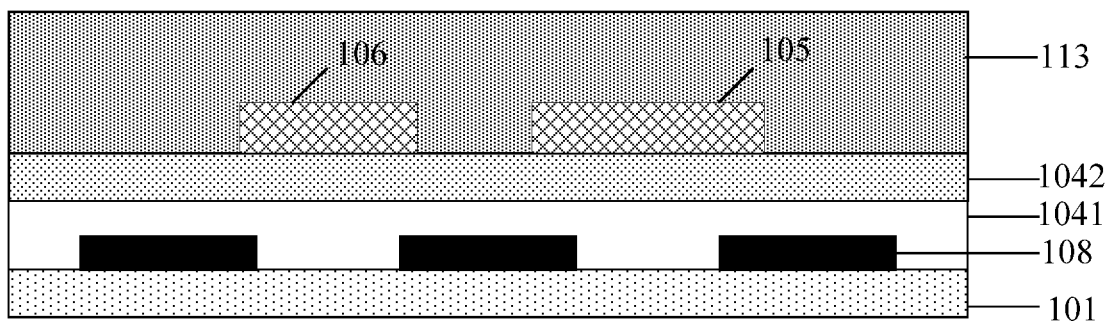
FIG. 6 is a cross-sectional view of the transparent display panel taken along line AA' in FIG. 3.

Optionally, FIG. 6 is a cross-sectional view of the transparent display panel taken along line AA' in FIG. 3, in accordance with some embodiments of the present disclosure. Referring to FIG. 6, the dielectric layer 104 includes a passivation layer 1041 and a planarization layer 1042 disposed in a stacked manner. The passivation layer 1041 is disposed adjacent to the substrate 101, and the planarization layer 1042 is disposed on a side of the passivation layer 1041 facing away from the substrate 101.

For example, the passivation layer 1041 may include $SiO_x$, $SiN_x$, SiON, $AlO_x$, $HfO_x$, $TaO_x$, or the like. The embodiments of the present disclosure are not limited in detail, and may be set according to actual conditions.

Optionally, the planarization layer 1042 includes an organic insulating medium, and the planarization layer 1042 has a thickness in a range of 1.5-2 µm.

For example, the organic insulating medium of the planarization layer 1042 may include a polysiloxane type, an acrylic type, a polyimide type, or the like. The embodiments of the present disclosure are not limited in detail, and may be set according to actual conditions. The planarization layer may effectively reduce the effect of signal crosstalk.

Further, the transparent display panel may further include a pixel defining layer 113 covering the second power line 105, the second read line 106 and the first data line 108.

Optionally, the second power line 105 has a width in a range of 11-13 µm.

In the embodiment, since the second power line 105 is arranged above the first power line 102, the width of the second power line 105 may be set in the range of 11-13 µm. In comparison, when the second power line is arranged side by side with the data line (refer to FIG. 2), the width of the second power line may only be set in the range of 6-10 µm. Therefore, in the embodiment of the present disclosure, the width of the power line is increased, so that the resistance of the power line is reduced, thereby reducing the IR Drop effect.

Figure 7:
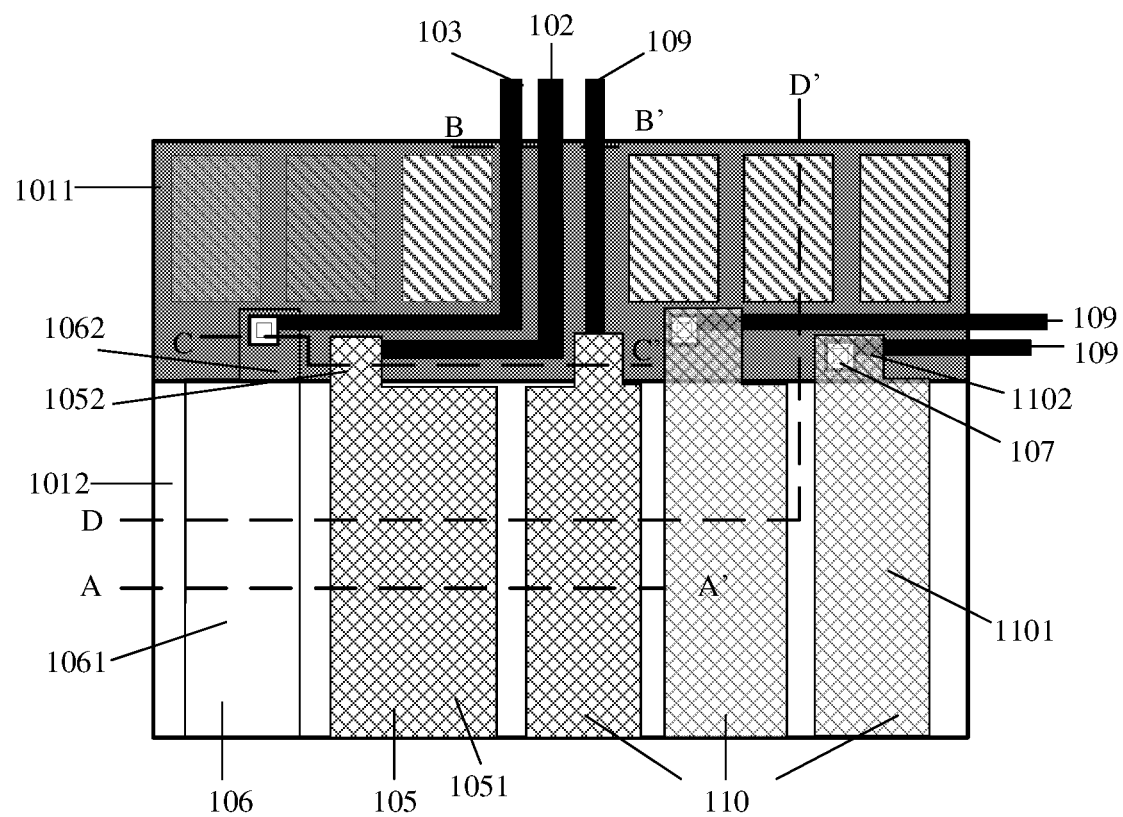
FIG. 7 is a plan view of a transparent display panel according to some other embodiments of the present disclosure.
Figure 8A:
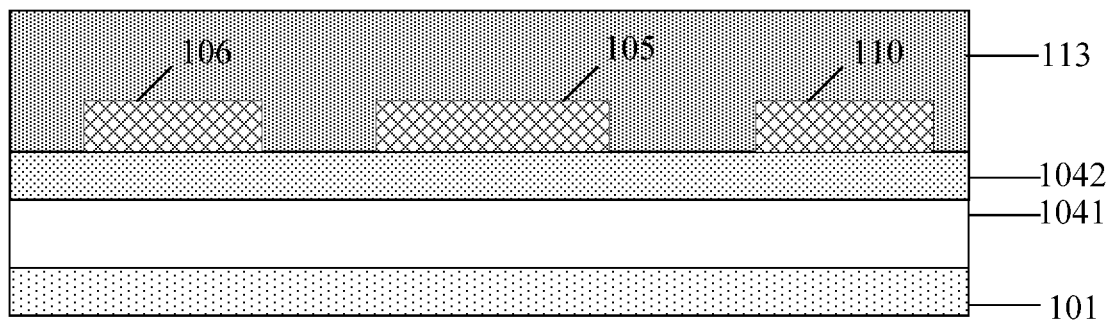
FIG. 8A is a cross-sectional view of the transparent display panel taken along line AA' in FIG. 7.
Figure 8B:
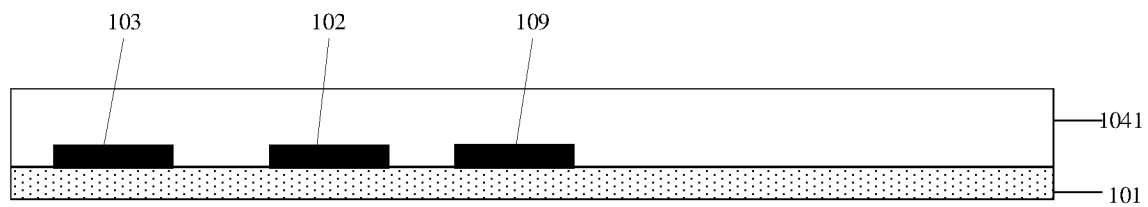
FIG. 8B is a cross-sectional view of the transparent display panel taken along line BB' in FIG. 7.

FIG. 7 is a plan view of a transparent display panel according to some embodiments of the present disclosure, FIG. 8A is a cross-sectional view of the transparent display panel taken along line AA' in FIG. 7, and FIG. 8B is a cross-sectional view of the transparent display panel taken along line BB' in FIG. 7. Referring to FIG. 7, FIG. 8A and FIG. 8B, the transparent display panel may include a substrate 101 including a non-transparent region 1011 and a transparent region 1012; a first power line 102 and a first read line 103 both on the substrate 101, an orthographic projection of each of the first power line 102 and the first read line 103 on the substrate 101 located within the non-transparent region 1011; and a second power line 105 and a second read line 106 both on the substrate 101.

The transparent display panel may further include a second data line 109 and a third data line 110 both on the substrate 101. An orthographic projection of the second data line 109 on the substrate 101 is located within the non-transparent region 1011.

Referring to FIG. 7, the orthographic projections of the second data line 109, the first power line 102 and the first read line 103 on the substrate 101 do not overlap with one another, that is, the second data line 109, the first power line 102 and the first read line 103 are spaced apart from one another.

Referring to FIG. 8A and FIG. 8B, the second data line 109 is arranged in the same layer as both the first power line 102 and the first read line 103, and the third data line 110 is arranged in the same layer as both the second power line 105 and the second read line 106. In other words, the second data line 109, the first power line 102 and the first read line 103 are all located within a first layer; the third data line 110, the second power line 105 and the second read line 106 are all located within a second layer, and the first layer and the second layer are different layers, for example, the first layer is on a side of the dielectric layer 104 facing towards the substrate 101, and the second layer is on a side of the dielectric layer 104 facing away from the substrate 101.

Referring to FIG. 7, an orthographic projection of the second power line 105 on the substrate 101 is located within the transparent region 1012 and extends to the non-transparent region 1011. Specifically, the second power line 105 includes a first portion 1051 and a second portion 1052, and an orthographic projection of the first portion 1051 of the second power line 105 on the substrate 101 is located within the transparent region 1012, and an orthographic projection of the second portion 1052 of the second power line 105 on the substrate 101 is located within the non-transparent region 1011.

Similarly, an orthographic projection of the second read line 106 on the substrate 101 is located within the transparent region 1012 and extends to the non-transparent region 1011. Specifically, the second read line 106 includes a first portion 1061 and a second portion 1062, and an orthographic projection of the first portion 1061 of the second read line 106 on the substrate 101 is located within the transparent region 1012, and an orthographic projection of the second portion 1062 of the second read line 106 on the substrate 101 is located within the non-transparent region 1011.

An orthographic projection of each third data line 110 on the substrate 101 is located within the transparent region 1012 and extends to the non-transparent region 1011. Specifically, the third data line 110 includes a first portion 1101 and a second portion 1102, and an orthographic projection of the first portion 1101 of the third data line 110 on the substrate 101 is located within the transparent region 1012, and an orthographic projection of the second portion 1102 of the third data line 110 on the substrate 101 is located within the non-transparent region 1011.

Figure 8C:
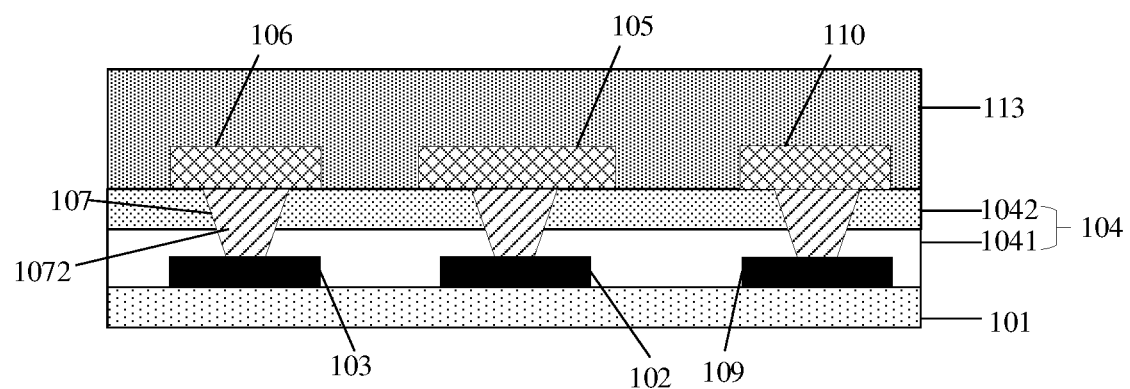
FIG. 8C is a cross-sectional view of the transparent display panel taken along line CC' in FIG. 7.

FIG. 8C is a cross-sectional view of the transparent display panel taken along line CC' in FIG. 7. Referring to FIG. 7 and FIG. 8C, a plurality of via holes 107 are formed in the dielectric layer 104, and each of the via holes 107 is filled with conductive material to form a conductive plug 1072 therein. The second power line 105 is electrically connected to the first power line 102 through a first conductive plug 1072, the second read line 106 is electrically connected to the first read line 103 through a second conductive plug 1072, and the third data line 110 is electrically connected to the second data line 109 through a third conductive plug 1072.

Referring to FIG. 7, orthographic projections of the third data line 110, the second power line 105, and the second read line 106 on the substrate 101 do not overlap with one another. Specifically, the orthographic projections of the third data line 110, the second power line 105, and the second read line 106 on the substrate 101 are spaced apart from one another by a certain distance. Since the third data line 110, the second power line 105, and the second read line 106 are all located in the same layer, they are spaced apart from one another by a certain distance so that it may avoid the third data line 110, the second power line 105, and the second read line 106 from being electrically connected to one another.

For example, the second data line 109 may employ source-drain metal, and the third data line 110 may employ anode metal. Thus, by forming the third data line from the anode metal, the haze may be further reduced, and the transparent display effect may be improved.

For example, the second data line 109, the first power line 102 and the first read line 103 located in the same layer may be formed of the source-drain metal, and the third data line 110, the second power line 105 and the second read line 106 located in the same layer may be formed of the anode metal.

Figure 9:
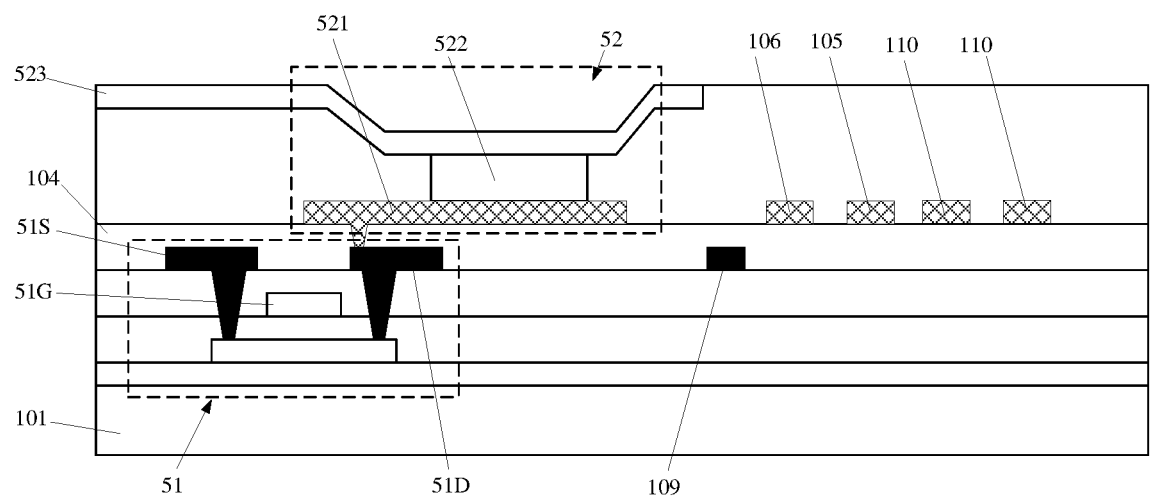
FIG. 9 is a cross-sectional view of the transparent display panel taken along line DD' in FIG. 7.

FIG. 9 is a cross-sectional view of the transparent display panel taken along line DD' in FIG. 7. Referring to FIGS. 8A, 8B and 9, the second data line 109, the first power line 102, and the first read line 103 may all be located in the same layer as the source electrode 51S and the drain electrode 51D of the thin film transistor 51 (e.g., the driving transistor TFT1 shown in FIG. 1), and the third data line 110, the second power line 105, and the second read line 106 may all be located in the same layer as the anode 521 of the OLED display device.

In this way, the second data line, the first power line, and the first read line may be formed through the same patterning process as the source electrode and the drain electrode of the thin film transistor, and the third data line, the second power line, and the second read line may be formed through the same patterning process as the anode, so that the line arrangement provided by the embodiments of the present disclosure may be realized without increasing the complexity of the manufacturing process. Moreover, the third data line, the second power line, and the second read line may all be formed of the anode metal, so that the haze may be reduced and the transparent display effect may be further improved.

Figure 10:
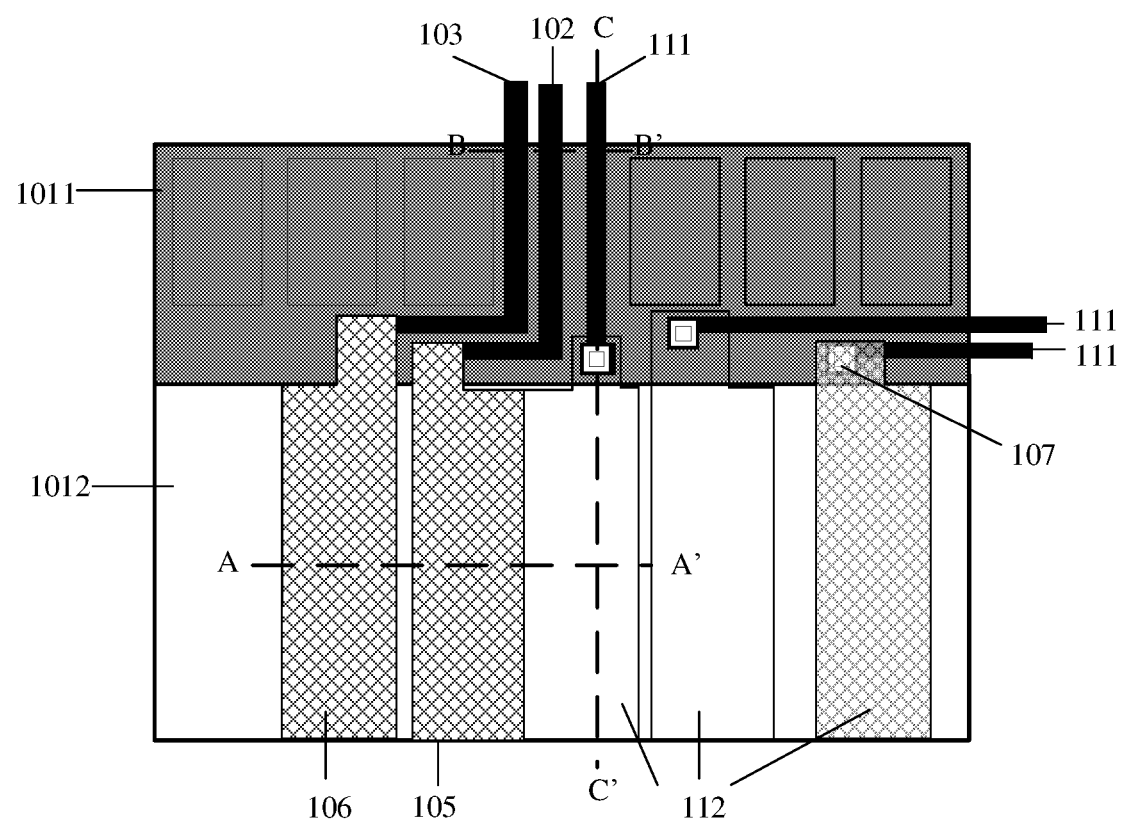
FIG. 10 is a schematic plan view of a transparent display panel according to some other embodiments of the present disclosure.
Figure 11A:
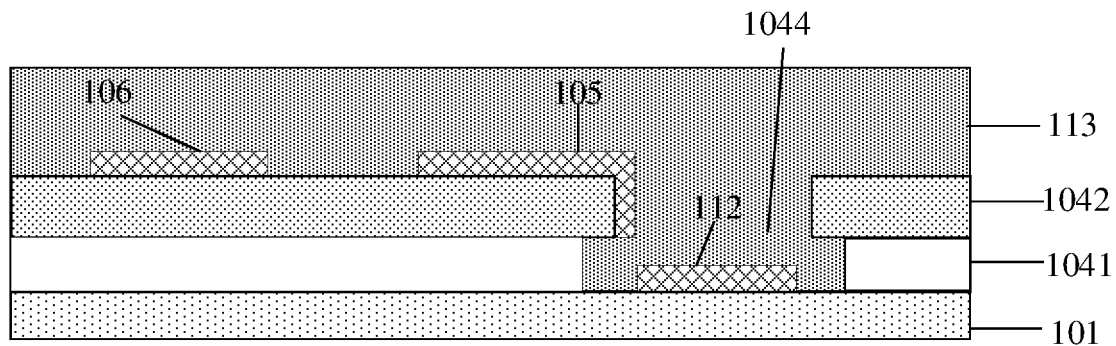
FIG. 11A is a cross-sectional view of the transparent display panel taken along line AA' in FIG. 10.
Figure 11B:
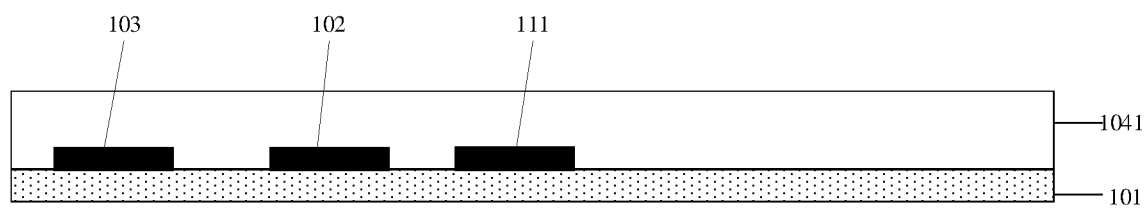
FIG. 11B is a cross-sectional view of the display panel taken along line BB' in FIG. 10.
Figure 11C:
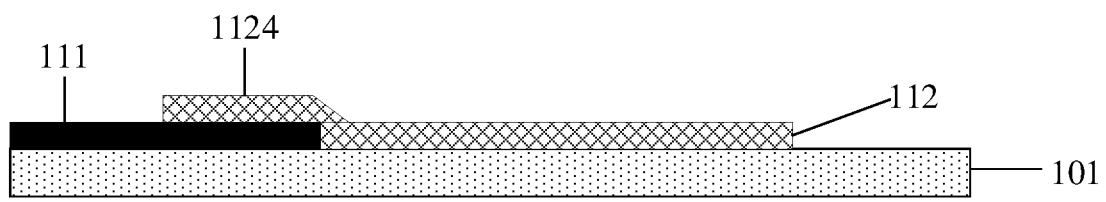
FIG. 11C is a cross-sectional view of the transparent display panel taken along line CC' in FIG. 10.

FIG. 10 is a schematic plan view of a transparent display panel according to some embodiments of the present disclosure, FIG. 11A is a cross-sectional view of the transparent display panel taken along line AA' in FIG. 10, FIG. 11B is a cross-sectional view of the display panel taken along line BB' in FIG. 10, and FIG. 11C is a cross-sectional view of the transparent display panel taken along line CC' in FIG. 10. Referring to FIG. 10 and FIG. 11A, the transparent display panel may include: a substrate 101 including a non-transparent region 1011 and a transparent region 1012; a first power line 102 and a first read line 103 both on the substrate 101, an orthographic projection of each of the first power line 102 and the first read line 103 on the substrate 101 located within the non-transparent region 1011; a second power line 105 and a second read line 106 both on the substrate 101. An orthographic projection of each of the second power line 105 and the second read line 106 on the substrate 101 is located within the transparent region 1012 and extends to the non-transparent region 1011. It should be noted that structures and arrangements of the first power line 102, the first read line 103, the second power line 105, and the second read line 106 may be referred to the above descriptions, and are not repeated here, thus differences between this embodiment and the above embodiments will be mainly described hereinafter.

Referring to FIG. 10 and FIG. 11A, the transparent display panel further includes a fourth data line 111 and a fifth data line 112. The fourth data line 111 is arranged in the same layer as both the first power line 102 and the first read line 103, and an orthographic projection of the fourth data line 111 on the substrate 102 is located within the non-transparent region 1011.

Referring to FIGS. 11A, 11B, and 11C, the fifth data line 112 is located at a different height from each of the second power line 105 and the second read line 106, that is, a distance between the five data line 112 and an upper surface of the substrate 101 is not equal to a distance between the upper surface of the substrate 101 and each of the second power line 105 and the second read line 106. Optionally, the distance between the five data line 112 and the upper surface of the substrate 101 is less than the distance between the upper surface of the substrate 101 and each of the second power line 105 and the second read line 106. For example, the distance between the fifth data line 112 and the upper surface of the substrate 101 is equal to a distance between the upper surface of the substrate 101 and each of the first power line 102, the first read line 103, and the fourth data line 111. An orthographic projection of the fifth data line 112 on the substrate 101 is located within the transparent region 1012 and extends to the non-transparent region 1011.

As shown in FIG. 11C, the fourth data line 111 is electrically connected to the fifth data line 112. Specifically, the fourth data line 111 and the fifth data line 112 are located at the same height, so that they may be electrically connected through an overlapped connection, for example, through an overlapped portion 1124. Advantageously, the overlapped portion 1124 may be formed of the same material and through the same patterning process as the fifth data line 112. In this way, it is not necessary to electrically connect two different data lines by forming via holes, thereby simplifying the electrical connection of the data lines.

In the embodiment, similar to the first power line 102 and the first data line 103, the fourth data line 111 is formed in the non-transparent region 1011 by using the source-drain metal, referring to FIG. 11B. The dielectric layer 104 is formed on the first power line 102, the first read line 103, and the fourth data line 111. For example, the dielectric layer 104 may include a passivation layer 1041 and a planarization layer 1042. A recess 1044 is formed in the dielectric layer 104, and a pattern of the recess 1044 matches with a pattern of the fifth data line 112 to be formed. The recess 1044 may expose the fourth data line 111 in the non-transparent region 1011, and the recess 1044 may exposes the substrate 101 in the transparent region 1012. The anode metal is deposited on the dielectric layer 104, and a portion of the anode metal is deposited in the recess 1044 to form the fifth data line 112, referring to FIG. 11A. A portion of the fifth data line 112 located within the transparent region 1012 is formed on the substrate 101, and a portion of the fifth data line 112 extending to the non-transparent region 1011 is formed on the source-drain metal to form an electrical connection with the source-drain metal, referring to FIG. 11C. The patterning process is performed on the anode metal on the dielectric layer 104 to form the second power line 105 and the second read line 106.

Referring to FIG. 10 and FIG. 11A, one fifth data line 112 is adjacent to the second power line 105. In the transparent region 1012, there is no spacing between the orthographic projection of the fifth data line 112 on the substrate 101 and the orthographic projection of the adjacent second power line 105 on the substrate 101, that is, the spacing is equal to zero. In this way, the width occupied by the second power line 105, the second read line 106, and the fifth data line 112 may be reduced, so that the area of the transparent region may be increased, thereby increasing the transparency and improving the transparent display effect.

It should be noted that the pattern of the recess 1044 may also match with the pattern of the second power line or the second read line. The embodiments of the present disclosure are not limited in detail, and may be set according to actual conditions.

Therefore, in the embodiments of the present disclosure, the transparent display panel includes a substrate including the non-transparent region and the transparent region; the first power line and the first read line both on the substrate; the dielectric layer covering both the first power line and the first read line; the second power line and the second read line both on the dielectric layer. As the first power line and the first read line are arranged in a lower layer while the second power line and the second read line are arranged in an upper layer, so that the crosstalk between different signals is effectively reduced. Further, the area of the transparent region occupied by various signal lines is reduced, so that the haze is reduced, the transparency is increased, thereby improving the transparent display effect.

The embodiments of the present disclosure provide a transparent display apparatus, which may include the transparent display panel described in any of the above embodiments. It should be understood that the transparent display apparatus provided by the embodiments of the present disclosure have all the characteristics and advantages of the transparent display panel provided by the above embodiments, thus they are not repeated here.

Figure 12:
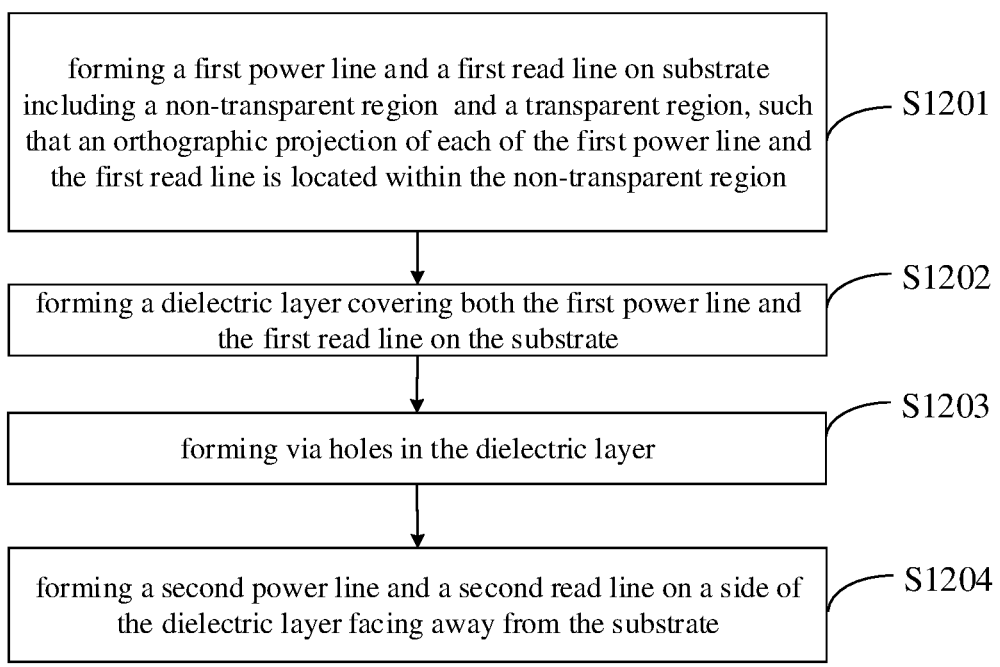
FIG. 12 is a flow chart of a method of manufacturing a transparent display panel according to some embodiments of the present disclosure.

FIG. 12 is a flow chart of a method of manufacturing a transparent display panel according to some embodiments of the present disclosure. Referring to FIGS. 3-12, the method may be performed as follows.

In step S1201, a first power line 102 and a first read line 103 are formed on a substrate 101. The substrate 101 includes a non-transparent region 1011 and a transparent region 1012, and an orthographic projection of each of the first power line 102 and the first read line 103 is located within the non-transparent region 1011.

Specifically, source-drain metal is deposited on the substrate 101, and the first power line 102 and the first read line 103 are formed through the same one patterning process such that the first power line 102 and the first read line 103 are located within the non-transparent region of the substrate 101. The source-drain metal may employ a single layer of metal such as Ag, Cu, Al, Mo; or a single layer of metal alloy such as AlNd or MoNb; or multilayered metal such as MoNb/Cu/MoNb; or a stacked structure such as Mo/AlNd/ITO, ITO/Ag/ITO and the like. The embodiments of the present disclosure are not limited thereto, and may be set according to actual conditions.

In step S1202, a dielectric layer 104 covering both the first power line 102 and the first read line 103 is formed on the substrate 101.

Specifically, a passivation layer 1041 such as $SiO_x$, $SiN_x$, SiON, $AlO_x$, $HfO_x$, $TaO_x$ or the like is first deposited; and a planarization layer 1042, for example, organic insulating medium such as a polysiloxane type, an acrylic type, a polyimide type or the like, is then deposited. The materials of the passivation layer and the planarization layer are not limited in detail in the embodiments of the present disclosure, and may be set according to actual conditions. The thickness of the planarization layer 1042 may be in a range of 1.5-2 µm, which serves to reduce signal crosstalk between different signal lines.

In step S1203, a via hole 107 is formed in the dielectric layer 104. Specifically, the via hole 107 may be formed through dry etching or wet etching, which is not limited in detail in the embodiments of the present disclosure, and may be selected according to actual conditions.

In step S1204, a second power line 105 and a second read line 106 are formed on a side of the dielectric layer 104 facing away from the substrate 101.

Specifically, anode metal may be deposited on the dielectric layer 104, and the second power line 105 and the second read line 106 may be formed through the same one patterning process. The anode metal is deposited in the via hole 107 to form the conductive plug 1072 such that the second power line 105 is electrically connected to the first power line 102 through a first conductive plug 1072 located in the via hole in the dielectric layer, and the second read line 106 is electrically connected to the first read line 103 through a second conductive plug 1072 located in the via hole in the dielectric layer.

For example, the anode metal may employ an ITO/Ag/ITO stacked structure, which is not limited in detail in the embodiments of the present disclosure, and may be selected according to actual conditions.

Optionally, an orthographic projection of each of the second power line 105 and the second read line 106 on the substrate 101 is located within the non-transparent region 1011, and the first data line 108 is also formed when the first power line 102 and the first read line 103 are formed such that the first power line 102, the first read line 103, and the first data line 108 are all arranged in the same layer. An orthographic projection of the first data line 108 on the substrate 101 is partially covered by an orthographic projection of each of the second power line 105 and the second read line 106 on the substrate 101.

Specifically, source-drain metal is deposited on the substrate 101, and the first power line 102, the first read line 103, and the first data line 108 are formed through the same one patterning process. After the second power line 105 and the second read line 106 are formed, the second power line 105 and the second read line 106 are both located above the first data line 108, and an orthographic portion of the second power line 105 on the substrate 101 partially covers an orthographic projection of the first data line 108 on the substrate 101, and an orthographic projection of the second read line 106 on the substrate 101 partially covers an orthographic projection of the first data line 108 on the substrate 101.

Optionally, an orthographic projection of each of the second power line 105 and the second read line 106 on the substrate 101 is located within the transparent region 1012 and extends to the non-transparent region 1011.

When the first power line 102 and the first read line 103 are formed, a second data line 109 is further formed such that the first power line 102, the first read line 103, and the second data line 109 are all arranged in the same layer. An orthographic projection of the second data line 109 on the substrate 101 is located within the non-transparent region 1011.

When the second power line 105 and the second read line 106 are formed, a third data line 110 is further formed such that the second power line 105, the second read line 106, and the third data line 110 are all arranged in the same layer. An orthographic projection of the third data line 110 on the substrate 101 is located within the transparent region 1012 and extends to the non-transparent region 1011, and a portion of the third data line 110, an orthographic projection of which is located within the non-transparent region 1011, is electrically connected to the second data line 109 through a third conductive plug 1072 located in the via hole 107 in the dielectric layer 104.

Specifically, the source-drain metal is deposited on the substrate 101, and the first power line 102, the first read line 103, and the second data line 109 are formed through the same one patterning process, and the second data line 109 is located within the non-transparent region 1011. The dielectric layer 104 covers the first power line 102, the first read line 103, and the second data line 109, and a via hole 107 is formed in the dielectric layer 104. The anode metal is deposited on the dielectric layer 104, and the second power line 105, the second read line 106, and the third data line 110 are formed through the same one patterning process. The third data line 110 is located within the transparent region 1012 and extends to the non-transparent region 1011, and a portion of the third data line 110, which is located within the non-transparent region 1011, is electrically connected to the second data line 109 through the conductive plug 1072 located in the via hole 107.

Optionally, when the first power line 102 and the first read line 103 are formed, a fourth data line 111 is further formed, such that the first power line 102, the first read line 103, and the fourth data line 111 is arranged in the same layer. An orthographic projection of the fourth data line 111 on the substrate 101 is located within the non-transparent region 1011.

A recess 1044 is formed in the dielectric layer 104, for example, a pattern of the recess 1044 matches with a pattern of a fifth data line 112 to be formed.

The anode metal is deposited on the dielectric layer 104 to form the fifth data line 112 in the recess 1044, and to form a second power line 105 and a second read line 106 on the dielectric layer 104. An orthographic projection of each of the fifth data line 112, the second power line 105, and the second read line 106 on the substrate 101 is located within the transparent region 1012 and extends to the non-transparent region 1011.

Specifically, the fourth data line 111 is formed in the non-transparent region 1011 by using the source-drain metal. The dielectric layer 104 is formed on the first power line 102, the first read line 103, and the fourth data line 111. The recess 1044 is formed in the dielectric layer 104, the pattern of the recess 1044 matching with the pattern of the fifth data line 112. The recess 1044 exposes the fourth data line 111 in the non-transparent region 1011, and the recess 1044 exposes the substrate 101 in the transparent region 1012. The anode metal is deposited on the dielectric layer 104, so that the anode metal is deposited in the recess 1044 to form the fifth data line 112. A portion of the fifth data line 112 in the transparent region 1012 is formed on the substrate 101, and a portion of the fifth data line 112 extending to the non-transparent region is formed on the source-drain metal to form an electrical connection with the source-drain metal. The anode metal on the dielectric layer 104 is patterned through the same one patterning process to form the second power line 105 and the second read line 106. Each of the fifth data line 112, the second power line 105, and the second read line 106 is located within the transparent region 1012 and extends to the non-transparent region 1011. Finally, a pixel defining layer 113 may cover the second power line 105, the second read line 106, and the fifth data line 112. In this way, a spacing between the fifth data line 112 and the second power line 105 or the second read line 106 becomes small, thereby increasing the area of the transparent region and improving the transparent display effect.

Therefore, in the method of manufacturing the transparent display panel provided by the embodiments of the present disclosure, the first power line and the first read line are arranged in a lower layer while the second power line and the second read line are arranged in an upper layer, so that the crosstalk between different signals is effectively reduced. Further, the area of the transparent region occupied by the various signal lines is reduced, so that the haze is reduced and the transparency is increased, thereby improving the transparent display effect.

It should be noted that various embodiments herein are described in a progressive manner, and each embodiment is described by focusing on differences from other embodiments, and the same or similar parts between any two embodiments may be referred to each other.

It should also be noted that, relational terms such as first, second or the like are used merely to distinguish one entity or operation from another entity or operation, without necessarily requiring or implying these entities or operations have any such actual relationships or orders. Furthermore, terms "comprise", "comprising" or any other variations are intended to encompass a non-exclusive inclusion, such that a process, a method, an item or an apparatus comprising a series of elements not only includes these elements, but also includes other elements which are not clearly listed, also includes elements that are inherent to such a process, method, item, or apparatus. Unless otherwise stated, a phrase "comprising an element . . . " does not exclude the presence of additional equivalent elements in the process, method, item, or apparatus including the element.

The transparent display panel, the transparent display apparatus, and the method of manufacturing the transparent display panel provided by the present disclosure are described in detail above. The principles and implementations of the present disclosure are described herein by taking specific examples. The above embodiments are only used to help understand the present disclosure and the inventive concept thereof. Moreover, according to the concept of the present disclosure, there will be changes to the specific embodiments and application scopes for those skilled in the art. Therefore, the contents of the specification are not to be construed as limiting the present disclosure.

What is claimed is:

1. A transparent display panel comprising:
   a substrate comprising a non-transparent region and a transparent region;
   a first power line and a first read line both disposed on the substrate and arranged in a same layer, an orthographic projection of each of the first power line and the first read line on the substrate located within the non-transparent region;
   a dielectric layer covering both the first power line and the first read line;
   a second power line and a second read line both disposed on a side of the dielectric layer facing away from the substrate and arranged in a same layer, wherein the second power line is electrically connected to the first power line through a first conductive plug extending through the dielectric layer, and the second read line is electrically connected to the first read line through a second conductive plug extending through the dielectric layer.

2. The transparent display panel of claim 1, further comprising a plurality of first data lines,
wherein the plurality of first data lines are arranged in the same layer as both the first power line and the first read line, an orthographic projection of the second power line on the substrate at least partially overlaps with an orthographic projection of at least one of the first data lines on the substrate, and an orthographic projection of the second read line on the substrate at least partially overlaps with an orthographic projection of at least one of the first data lines on the substrate.

3. The transparent display panel of claim 2, wherein an orthographic projection of each of the first power line, the first read line and the first data lines on the substrate is located within the non-transparent region.

4. The transparent display panel of claim 2, wherein an orthographic projection of each of the second power line and the second read line on the substrate is located within the non-transparent region.

5. The transparent display panel of claim 1, further comprising a second data line and a third data line,
wherein the second data line is arranged in the same layer as both the first power line and the first read line, and an orthographic projection of the second data line on the substrate is located within the non-transparent region; and
wherein the third data line is arranged in the same layer as both the second power line and the second read line, and the third data line is electrically connected to the second data line through a third conductive plug extending through the dielectric layer.

6. The transparent display panel of claim 5, wherein an orthographic projection of the third data line, an orthographic projection of the second power line, and an orthographic projection of the second read line on the substrate are spaced apart from one another.

7. The transparent display panel of claim 5, wherein each of the second power line, the second read line, and the third data line comprises a first portion and a second portion, an orthographic projection of the first portion of each of the second power line, the second read line, and the third data line on the substrate is located within the transparent region, and an orthographic projection of the second portion of each of the second power line, the second read line, and the third data line on the substrate is located within the non-transparent region.

8. The transparent display panel of claim 7, wherein each of the first conductive plug, the second conductive plug, and the third conductive plug is located within the non-transparent region.

9. The transparent display panel of claim 1, further comprising a fourth data line and a fifth data line,
wherein the fourth data line is arranged in the same layer as both the first power line and the first read line; and
wherein a distance between the fifth data line and an upper surface of the substrate is equal to a distance between the fourth data line and the upper surface of the substrate, the distance between the fifth data line and the upper surface of the substrate is less than a distance between the upper surface of the substrate and at least one of the second power line and the second read line, and the fifth data line is electrically connected to the fourth data line.

10. The transparent display panel of claim 9, wherein a recess exposing the substrate is formed in the dielectric layer, and the fifth data line is located in the recess.

11. The transparent display panel of claim 9, wherein each of the second power line, the second read line, and the fifth data line comprises a first portion and a second portion, an orthographic projection of the first portion of each of the second power line, the second read line, and the fifth data line on the substrate is located within the transparent region, and an orthographic projection of the second portion of each of the second power line, the second read line, and the fifth data line on the substrate is located within the non-transparent region.

12. The transparent display panel of claim 11, wherein a spacing between an orthographic projection of the first portion of the fifth data line on the substrate and an orthographic projection of one of the second power line and the second read line on the substrate is equal to zero.

13. The transparent display panel of claim 1, further comprising:
a thin film transistor on the substrate, the thin film transistor comprising a source electrode and a drain electrode arranged in a same layer; and
an OLED display device on the substrate, the OLED display device comprising an anode,
wherein each of the first power line and the first read line is arranged in the same layer as both the source electrode and the drain electrode, and each of the second power line and the second read line is arranged in the same layer as the anode.

14. The transparent display panel of claim 1, wherein the dielectric layer comprises a passivation layer and a planarization layer disposed in a stacked manner, and the planarization layer is located on a side of the passivation layer facing away from the substrate.

15. A transparent display apparatus comprising the transparent display panel of claim 1.

16. A method of manufacturing a transparent display panel, comprising:
forming a first power line and a first read line on the substrate such that the first power line and the first read line are arranged in the same layer;
forming a dielectric layer covering both the first power line and the first read line on the substrate;
forming via holes in the dielectric layer; and
forming a second power line and a second read line on a side of the dielectric layer facing away from the substrate, such that the second power line and the second read line are arranged in the same layer, the second power line is electrically connected to the first power line through a first conductive plug located in one of the via holes in the dielectric layer, and the second read line is electrically connected to the first read line through a second conductive plug located in one of the via holes in the dielectric layer.

17. The method of claim 16, wherein the step of forming the first power line and the first read line on the substrate comprises:
forming a first data line while forming the first power line and the first read line, such that the first power line, the first read line, and the first data line are arranged in the same layer.

18. The method of claim 16, wherein the step of forming the first power line and the first read line on the substrate comprises:
forming a second data line while forming the first power line and the first read line, such that the first power line, the first read line, and the second data line are arranged in the same layer; and
wherein the step of forming the second power line and the second read line on the side of the dielectric layer facing away from the substrate comprises:
forming a third data line while forming the second power line and the second read line, such that the second power line, the second read line, and the third data line are arranged in the same layer, and the third data line is electrically connected to the second data line through a third conductive plug located in one of the via holes in the dielectric layer.

19. The method of claim 16, wherein the step of forming the first power line and the first read line on the substrate comprises:
forming a fourth data line while forming the first power line and the first read line, such that the first power line, the first read line, and the fourth data line are arranged in the same layer;
wherein the step of forming the via holes in the dielectric layer comprises:
forming the via holes in the dielectric layer to expose both the first power line and the first read line; and
forming a recess in the dielectric layer to expose the substrate; and
wherein the step of forming the second power line and the second read line on the side of the dielectric layer facing away from the substrate comprises:
forming a fifth data line in the recess while forming the second power line and the second read line, such that the fifth data line is electrically connected to the fourth data line.

20. The method of claim 16, further comprising: forming a thin film transistor and an OLED display device on the substrate,
wherein the thin film transistor comprises a source electrode and a drain electrode arranged in the same layer, and the OLED display device comprises an anode; and
wherein each of the first power line and the first read line is formed through the same one patterning process as both the source electrode and the drain electrode, and each of the second power line and the second read line is formed through the same one patterning process as the anode.

* * * * *